United States Patent [19]

Schmidt et al.

[11] 4,300,965

[45] Nov. 17, 1981

[54] PROCESS FOR CEMENTING SEMICONDUCTOR DISCS TO CARRIER PLATES AND PRODUCT SO OBTAINED

[75] Inventors: Dietrich Schmidt; Bruno Meissner; Heinz-Jörg Rath; Dieter Regler; Jürgen Voss, all of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 766,457

[22] Filed: Feb. 7, 1977

[30] Foreign Application Priority Data

Mar. 1, 1976 [DE] Fed. Rep. of Germany ....... 2608427

[51] Int. Cl.$^3$ ............................................. B32B 31/00
[52] U.S. Cl. ..................................... 156/154; 51/323; 156/155; 156/247; 156/286; 156/299; 156/332; 156/344; 260/32.8 R; 260/33.4 R; 260/33.4 P; 528/306
[58] Field of Search ............... 156/332, 154, 155, 241, 156/247, 286, 298, 299, 344; 264/345, 346; 260/33.4 P, 33.4 R, 32.8 R, 75 T, 75 R; 51/323; 29/424, 589; 428/480; 252/364

[56] References Cited

U.S. PATENT DOCUMENTS

| | | | |
|---|---|---|---|
| 1,950,468 | 3/1934 | Zwilgmeyer | 260/75 R |
| 2,394,689 | 2/1946 | Heyman | 260/32.8 R |
| 3,335,087 | 8/1967 | Keers | 252/364 |
| 3,452,133 | 6/1969 | Bratton et al. | 264/346 |
| 3,475,867 | 11/1969 | Walsh | 156/155 |
| 3,586,559 | 6/1971 | Shepard | 156/155 |
| 4,014,091 | 3/1977 | Kodera et al. | 156/285 |

*Primary Examiner*—John J. Gallagher
*Attorney, Agent, or Firm*—Allison C. Collard; Thomas M. Galgano

[57] ABSTRACT

Process for cementing semiconductor discs to a carrier plate for subsequent polishing, which comprises applying to the discs a cementing solution being composed of (a) a resin of a melting range between 50° and 180° C. and a melt viscosity between 1000 and 6000 P;
(b) a substance acting as plasticizer for the resin at cementing temperatures; and
(c) a solvent for the resin and the plasticizer, which evaporizes at cementing temperatures, while avoiding during the application the occlusion of air bubbles between discs and cementing layer, and exerting pressure onto the plates at a temperature between cementing temperatures and 30° C. below the same. The invention also comprises the carrier plate carrying one or more discs cemented thereto by the above process.

8 Claims, 1 Drawing Figure

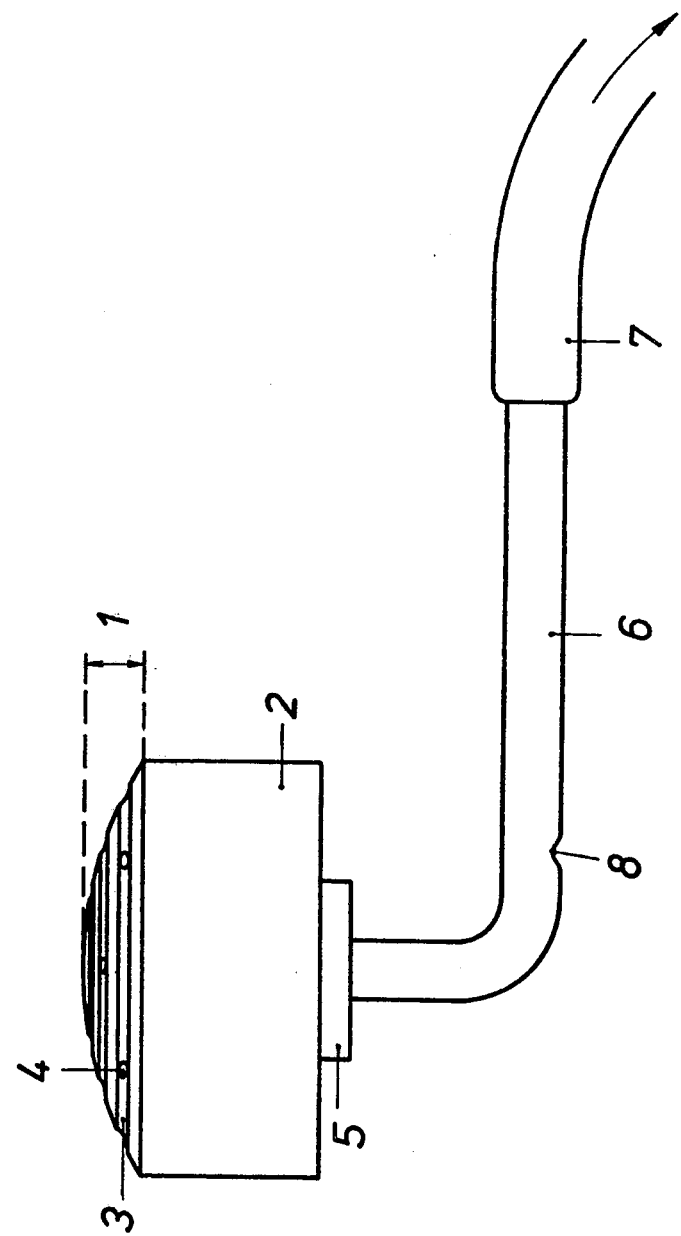

PROCESS FOR CEMENTING SEMICONDUCTOR DISCS TO CARRIER PLATES AND PRODUCT SO OBTAINED

The present invention relates to a process for cementing a semiconductor disc to a carrier plate, in which a layer of a cement is applied to the carrier plate and the semiconductor disc is placed on the said layer.

In planar technology for the manufacture of integrated circuits, various layers of differing conductivities or conductivity types are built up from the surface of a monocrystalline semiconductor disc in order to provide the various individual circuit-components required. The individual layers are produced by successive processes, some of which are photolithographic processes, which involve applying a photo-lacquer to the surface of the disc and subsequently exposing it. If, however, the surface of the disc is not perfectly flat, blurring can result from the exposure of the photo-lacquer and this prevents or hinders the manufacture of components on the disc with a high circuit-packing density.

In customary processes for the polishing or lapping of semiconductor discs, the discs are cemented onto a carrier plate or polishing plate, which is subsequently fixed in a polishing machine and the exposed surface of each disc is polished.

The cements conventionally used for affixing the discs to the carrier plate consist, for example, of paraffin, picein or wax/colophony mixtures. A layer of the cement is applied to the carrier plate and the discs are subsequently placed on the said layer, usually by means of a conventional suctional manipulator. Pressure is then applied to the discs to secure them to the cement, and the cement layer is subsequently cured.

It is possible, however, for air bubbles to become trapped under a disc when it is applied to the cement and this can result in the disc becoming buckled or otherwise distorted during the subsequent application of pressure to the disc and curing of the cement layer. If the disc is subsequently polished in this distorted state, the result is that, after being removed from the carrier plate and returning to an undistorted state, the disc has a surface that is not perfectly flat but is undulating or wavy or rippled.

The degree to which the surface of the disc undulates also depends on the nature of the carrier plate used: the harder the carrier plate, the lower is the degree of undulation of the disc surface, but also the less reflective is the surface, whereas the softer the carrier plate, the smoother and more reflective, but also the more undulating, is the surface.

It is the object of the invention to provide a process for cementing semiconductor discs to a carrier plate, said discs having after a polishing operation a perfectly flat surface free of undulations and a high degree of reflection.

The present invention achieves this object by providing a process for cementing a semiconductor disc to a carrier plate, which comprises the steps of, first, applying to the carrier plate a layer of a cement solution consisting of (a) from 60 to 95 parts by weight of a resin having a melting range (determined as hereinafter specified) wholly within the temperature range of from 50° to 180° C., the upper limit of the melting range being not more than 20° C. above the cementing temperature to be used, and having a melt viscosity at 20° C. within the range of from 1000 to 6000 P, (b) from 5 to 40 parts by weight of an additional substance (as herein defined) which adds up to 100 parts by weight with the amount of resin used that is substantially miscible with the resin at temperatures above 20° C. and that has a melting point within the range of 0° to 25° C. below the cementing temperature to be used and exhibits plasticizer properties at the chosen cementing temperature, and (c) from 75 to 250 parts by weight, based on the total weight of components (a) and (b), of a solvent for the resin and the additional substance, the solvent having a boiling point that is lower than the cementing temperature to be used;

secondly, heating the carrier plate and layer of cement solution to a temperature within the range of from 50° to 160° C., until the solvent has substantially evaporated from the cement solution;

thirdly, placing the semiconductor disc onto the cement layer, at the said cementing temperature, while avoiding air occlusions between the disc and connecting layer;

fourthly, applying pressure to the semiconductor disc to secure it to the cement layer, while the carrier plate and the cement layer are at a temperature within the range of from 30° C. below the cementing temperature to the cementing temperature;

The cement layer is then cooled in order to allow it to set.

The resin used as component (a) of the cement solution should have a melting range wholly within the temperature range of from 50° to 180° C., and preferably within the temperature range of from 70° to 130° C. when determined according to Kofler.

The melting range of the resin as shown above is defined by a lower limit and an upper limit, both of which are determined in a conventional manner by means of a Kofler heating block. A Kofler heating block essentially consists of a long narrow metal body in which a temperature gradient may be set up by electrically heating one end of the block. The block has a chromium-plated surface on which the material is placed whose melting point is to be determined. Local changes in the physical state of the material are observed as the block is heated and are correlated, by means of a temperature scale, with the temperature at the respective part of the block. This method is particularly suitable for determination of the melting point range of the resin used according to the present invention and is more accurate and less complicated than the conventional capillary method of melting-point determination. The lower limit of the melting range of the resin is defined for the present purposes, as the temperature at which the first visible change of the resin powder occurs as the block is heated, and the upper limit is defined as the temperature at which the sintered resin fuses together to give a coherent thread (i.e., the melting point proper of the resin).

It is one condition which the resin should fulfill that the upper limit of the melting range should not be more than 20° C. higher than the chosen cementing temperature, which lies at 50° to 160° C., preferably 90° to 110° C.

A further condition that the resin must satisfy is that its melt viscosity, as determined at 20° C. above the upper limit of the melting range of the resin, should fall within the range of from 1000 to 6000 P.

Examples of resins suitable for use in the present process are, e.g., hydrocarbon resins, especially aromatic hydrocarbon resins, such as coumaroneindene resins; phenolic resins; polyterpene resins, pentaerythritol resin esters of dehydrogenated colophony; zinc/calcium/colophony resins; very suitable are further glycerol resin esters of dehydrogenated colophony or of polymerized colophony, and maleate resins, i.e., a mixed ester from tri-carboxylic acid with .24 carbon atoms (derived by a "Diels-Alder-addition" of abietic acid with maleic acid), abietic acid and glycerine which are a preferred group.

Component (b) of the cement solution is a compound that, at the cementing temperature to be used, will exhibit plasticizing properties toward the resin, that is to say, will cause a reduction in the viscosity of the resin. In other words, a mixture of the resin and the plasticizer, in the proportions specified above, should, at the cementing temperature to be used, have a viscosity lower than that of the resin alone at the said cementing temperature. The melting point of the added compound should be 0°–25° C. below the cementing temperature.

The plasticizing compound is required to be substantially miscible with the resin at temperatures above 20° C., by which is meant that if a mixture of the resin and the plasticizer is cooled to a temperature of 20° C., the mixture should not demix or separate out to such an extent that either component flocculates or precipitates.

Suitable plasticizing additives are, e.g., 2,4,6-trichloroaniline, coumarin, 4-chloroaniline, diphenylene oxide, 4,4'-diaminodiphenylmethane, 1,2,3-xylenol, 1,2,4-xylenol, 1,2,5-xylenol, 1,2,6-xylenol, 1,3,4-xylenol, 1,3,5-xylenol, benzylphenol, 2,3-dimethylquinoline, butyl p-aminobenzoate and 2,4-dichloroaniline, and especially benzil and α-naphthol are suitable as plasticizers for use in the present process.

The solvent used as component (c) of the cement solution, only those are suitable which have a boiling point that is lower than the cementing temperature to be used and, advantageously, having a melting point of at least 20° C.

The solvent should readily dissolve the resin and the plasticizer, in the proportions given above, at 20° C. That is to say, 75–250 parts by weight of solvent should be sufficient to dissolve 100 parts by weight of a mixture of resin and plasticizer.

Actually the cementing solution is prepared from the individual components by compounding 60–95 parts by weight of resin, 5–40 parts by weight of plasticizing additive, the two compounds adding up to 100 parts by weight, and 75–250 parts by weight of solvent. Sometimes, it is advantageous, to dissolve resin and plasticizer separately and to mix the two solutions together. Dissolution is usually effected at room temperature, that is, at about 20° C., and may be accelerated by shaking the mixture of components in a shaking machine for several hours. The cement solutions thus prepared are generally stable for several days and therefore it is not necessary to prepare a fresh solution each time it is required.

A layer of the cement solution is applied to the carrier plate, which will normally be a polishing plate suitable for use in a polishing machine for lapping semiconductor discs. The cement solution may be applied, for example, by means of a knife, or spatula, but is advantageously whirler-coated onto the carrier plate, that is to say, it is applied by pouring the solution from a calibrated vessel onto the center of the carrier plate while the latter is being rotated about its vertical axis. The application of the cement solution is preferably effected at room temperature, that is at about 20° C. The quantity of cement solution applied to the plate is advantageously such that, after evaporation of the solvent, the cement layer has a thickness of from 15 to 30 μm.

The carrier plate and the layer of cement solution thereon are then heated to a cementing temperature within the range of from 50° to 160° C., preferably from 90° to 110° C., until the solution has substantially evaporated. The amount of any residual solvent in the cement layer advantageously does not exceed 5% by weight, based on the total weight of components (a) and (b). This heating step will generally take only a few minutes.

The semiconductor disc is next placed onto the cement layer while the layer is at the cementing temperature at which temperature it is very viscous. The application may conveniently be done by lifting, carrying and placing the disc by means of a suctional manipulator. A suctional manipulator having a convex suction face, such as a calotte-shaped suction face, is particularly suitable for this purpose as it enables the disc to be placed on the cement layer in a simple manner and yet in such a way that no air bubbles are trapped below the disc. This is more fully explained hereinbelow.

An example of a suitable suctional manipulator is shown diagrammatically in perspective view in the accompanying FIGURE and will now be described.

The suctional manipulator comprises a hollow suction head 2 consisting of, for example, polyvinyl chloride, polytetrafluoroethylene or polyethylene, and a tubular handle 6 connected thereto by means of an annular gasket 5, e.g., rubber. The tubular handle 6 is provided with a vent 8 and communicates with the interior of the suction head 2. The suction head 2 has a calotte-shaped convex suction face 1, the radius of curvature of which may be from 30 to 200 times the diameter of the suction head 2: for example, with a suction-head diameter of 50 mm, the height of the vertex of the suction face 1 may be 0.1 mm. The suction face 1 is provided with a plurality of, preferably two to five, annular suction grooves 3, each suitably having a width of from 0.5 to 2.5 mm and a depth of from 0.2 to 1.5 mm. Each suction groove 3 is provided with a plurality of, preferably three to nine, holes 4 communicating with the interior of the suction head 2. The holes 4 should be equally spaced within each suction groove.

When the suctional manipulator is in use, the tubular handle 6 is connected to a suction pump (not shown) by means of a vacuum-tight rubber or plastic hose 7 and the pump is switched on. The manipulator is held by the tubular handle 6 with the suction face 1 lowermost. The manipulator is then placed with the suction face 1 on the upper side of a semiconductor disc and the vent 8 is closed, for example by means of the thumb, in order to apply suction to the disc via the holes 4. The disc is thus held by suction against the suction face 1 and assumes the curved shape of the said face. The disc may then be transferred to the carrier plate and lowered onto the cement layer. The center of the disc will contact the cement layer first and, when the suction is released by opening the vent 8, the disc will flip back into the flat state. Thus, any air between the disc and the cement layer will be radially expelled and the underside of the disc will be evenly wetted by the cement.

When the disc has been placed on the cement layer, pressure is applied to the disc in order to secure it to the cement layer. The temperature during this application of pressure should be equal to the cementing temperature or not lower than 30° C. below the cementing temperature. The pressure may be applied by means of the ram of a suitable press, the underside of the ram preferably being cushioned by means of a resilient material. A pressure of from 0.5 to 1.5 kp/cm² is suitable for this purpose and may be applied for a duration of from 0.5 to 5 minutes.

In accordance with a preferred manner of operation, the carrier plate, cement layer and semiconductor disc are heated to a temperature within the range of from the cementing temperature to 30° C. above that temperature. This heat treatment can aid in eliminating any distortions in the discs resulting from the pressure treatment. The duration of this heat treatment is preferably from 1 to 5 minutes.

Before being placed into a polishing device, the carrier plate, cement layer and semiconductor disc will be cooled in order to allow the cement layer to set slowly.

If desired, any cement residues between several discs on a single carrier plate may be removed in a conventional manner, for example, in a solvent vapor bath.

The semiconductor discs cemented to the carrier plate may be polished (lapped) in a conventional manner, for example, according to the process described and claimed in U.S. Pat. No. 3,874,129, in order to give a haze-free surface. It is found that, after polishing, discs that have been cemented to the carrier plate according to the process of the invention have a highly reflective surface and, especially if the optional heat treatment step has been included, a completely flat surface.

In the following, the process of the invention will be more fully described in two examples, which are given by way of illustration and not of limitation. All parts are by weight.

EXAMPLE 1

40 ml of a cement solution consisting of (a) 85 parts of a maleate resin (melting range according to Kofler 95°–105° C.; melt viscosity 2000 P at 125° C.), (b) 15 parts of α-naphthol (melting point 94° C.) and (c) 150 parts of trichloroethylene (boiling point 87° C.) were whirler-coated onto a circular aluminum carrier plate (diameter 60 cm) at room temperature of about 25° C. The carrier plate was heated to a cementing temperature of approximately 100° C. for 2 minutes in order to evaporate the solvent. This left a viscous cement layer having a thickness of 20–25 μm and a viscosity of 800 P. With the carrier disc and cement layer still at the cementing temperature, 27 silicon discs each having a diameter of 7.5 cm and a thickness of about 500 μm were placed on the cement layer by means of a suctional manipulator of the type shown in the accompanying drawing. A pressure of about 1 kp/cm² was subsequently applied to the discs at a temperature of about 95° C. The carrier plate, cement layer and discs were then heated to about 100° C. for 4 minutes, after which time the cement was already substantially set. The carrier plate was then cooled simply by removing it from the hot plate which had been used for heating, and put in a trichloroethylene vapor bath to remove cement residues from between the discs.

The discs were then polished in a polishing machine at about 50° C., where after they were allowed to cool to about 25° C. they were then prized off the carrier plate by means of a spatula. The discs each had a flawless flat surface.

EXAMPLE 2

The procedure of Example 1 was repeated using a cement solution consisting of (a) 93 parts of a glycerol resin ester of dehydrogenated colophony (melting range according to Kofler 60°–70° C.; melt viscosity 1900 P at 90° C.), (b) 7 parts of benzil (melting point 95° C.) and (c) 150 parts of trichloroethylene (boiling point 87° C.). The viscous cement layer remaining after evaporating the solvent had a melt viscosity of 350 P at 100° C.

The discs were subsequently polished at 30° C. and had a flawless flat surface.

What is claimed is:

1. A process for cementing a semiconductor disc to a carrier plate, which comprises the steps of:
    first, applying to the carrier plate a layer of a cement solution consisting of
    (a) from 60 to 95 parts by weight of a maleate resin having a melting range (determined according to Kofler) within the temperature range of from 50° to 180° C., the upper limit of the melting range being not more than 20° C. above the cementing temperature to be used, and having a melt viscosity (as determined at 20° C. above the upper limit of the melting range of the resin) within the range of from 1000 to 6000 P, and, complementally,
    (b) from 5 to 40 parts by weight of an additional substance selected from the group consisting of benzil or alpha-naphthol that is substantially miscible with the resin, and has a plasticizing effect on the resin at the chosen cementing temperature and that has a melting point within the range of from 0°–25° C. below the cementing temperature to be used, and
    (c) from 75 to 250 parts by weight, based on the total weight of components (a) and (b) of a solvent for the resin and the plasticizer, the solvent having a boiling point that is lower than the cementing temperature to be used and such that the solvent evaporates at the cementing temperature;
    secondly, heating the carrier plate and layer of cement solution to the cementing temperature which is a temperature within the range of from 50° to 160° C., until the solvent has substantially evaporated from the cement solution;
    thirdly, placing the semiconductor disc onto the cement layer, at the said cementing temperature in such a manner that occlusion of air bubbles between said disc and cementing layer is avoided;
    fourthly, applying pressure to the semiconductor disc to secure it to the cement layer, while the carrier plate and the cement layer are at a temperature within the range of from 30° C. below the cementing temperature to the cementing temperature; and
    fifthly, cooling the cement layer in order to allow it to set.

2. A process as claimed in claim 1, wherein component (a) of the cement solution has a melting range within the temperature range of from 70° to 130° C.

3. A process as claimed in claim 1 wherein component (c) of the cement solution has a melting point of at least 20° C.

4. A process as claimed in claim 1 wherein the cementing temperature is a temperature within the range of from 90° to 110° C.

5. A process as claimed in claim 1 wherein, after evaporation of the solvent, the cement layer has a thickness of from 15 to 30 μm.

6. A process as claimed in claim 1 wherein, subsequent to the fourth step of applying pressure to the semiconductor disc and prior to the fifth step of cooling the cement layer, the carrier plate, cement layer and semiconductor disc are heated to a temperature within the range of from the cementing temperature to 30° C. above the cementing temperature for removing mechanical distortions.

7. The process as claimed in claim 1, wherein the semiconductor disc is placed onto the cement layer by means of a suctional manipulator having a convex face in such a manner that it assumes a convex shape, the center of the disc contacting the cement layer first.

8. The process according to claim 1, additionally including the steps of polishing said semiconductor disc after said cement layer has set and thereafter removing said semiconductor disc from said carrier plate by prying it free by means of a tool.

* * * * *